(12) United States Patent
Privitera et al.

(10) Patent No.: US 11,404,567 B2
(45) Date of Patent: Aug. 2, 2022

(54) TRENCH-GATE FIELD EFFECT TRANSISTOR WITH IMPROVED ELECTRICAL PERFORMANCES AND CORRESPONDING MANUFACTURING PROCESS

(71) Applicant: STMICROELECTRONICS S.R.L., Agrate Brianza (IT)

(72) Inventors: Salvatore Privitera, Mascalucia (IT); Davide Giuseppe Patti, Mascalucia (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 290 days.

(21) Appl. No.: 16/518,883

(22) Filed: Jul. 22, 2019

(65) Prior Publication Data

US 2020/0027980 A1 Jan. 23, 2020

(30) Foreign Application Priority Data

Jul. 23, 2018 (IT) .......................... 102018000007441

(51) Int. Cl.
*H01L 29/78* (2006.01)
*H01L 29/66* (2006.01)

(52) U.S. Cl.
CPC .... *H01L 29/7813* (2013.01); *H01L 29/66734* (2013.01)

(58) Field of Classification Search
CPC ........... H01L 29/7813; H01L 29/66734; H01L 29/0696; H01L 29/1095
USPC .................................................. 257/40, 288
See application file for complete search history.

(56) References Cited

U.S. PATENT DOCUMENTS

| 5,321,289 | A | 6/1994 | Baba et al. |
| 6,107,661 | A | 8/2000 | Okabe et al. |
| 7,335,946 | B1 | 2/2008 | Bhalla et al. |
| 2008/0128829 | A1 | 6/2008 | Hshieh |
| 2010/0044786 | A1* | 2/2010 | Inomata .............. H01L 29/7813 257/330 |
| 2012/0307508 | A1 | 12/2012 | Fukui et al. |
| 2016/0079238 | A1* | 3/2016 | Siemieniec ......... H01L 29/7806 257/140 |

(Continued)

FOREIGN PATENT DOCUMENTS

| JP | 2001-168329 A | 6/2001 |
| WO | 01/20684 A1 | 3/2001 |

*Primary Examiner* — Matthew E. Gordon
(74) *Attorney, Agent, or Firm* — Seed IP Law Group LLP (57) ABSTRACT

A field effect transistor has a semiconductor layer with a top surface extending in a horizontal plane, and an active area defined in which are trench gate regions, which extend in depth with respect to the top surface and have an insulating coating layer and a conductive inner layer, and source regions, adjacent to the trench gate regions so as to form a conductive channel extending vertically. The trench gate regions have a plurality of first gate regions, which extend in length in the form of stripes through the active area along a first direction of the horizontal plane, and moreover a plurality of second gate regions, which extend in length in the form of stripes through the same active area along a second direction of the horizontal plane, orthogonal to, and crossing, the first gate regions. In particular, the first gate regions and second gate regions cross in the active area, joining with a non-zero curvature radius.

15 Claims, 6 Drawing Sheets

(56) References Cited

U.S. PATENT DOCUMENTS

| | | | | |
|---|---|---|---|---|
| 2016/0260829 A1* | 9/2016 | Aichinger | ............ | H01L 29/0878 |
| 2016/0293751 A1* | 10/2016 | Siemieniec | ......... | H01L 29/7813 |
| 2017/0005171 A1* | 1/2017 | Laforet | ............... | H01L 29/0696 |
| 2017/0110573 A1* | 4/2017 | Laforet | ............... | H01L 29/1095 |
| 2019/0386133 A1* | 12/2019 | Boianceanu | .......... | H01L 27/088 |

* cited by examiner

TRENCH-GATE FIELD EFFECT TRANSISTOR WITH IMPROVED ELECTRICAL PERFORMANCES AND CORRESPONDING MANUFACTURING PROCESS

BACKGROUND

Technical Field

The present solution relates to a field effect transistor (FET), in particular a power MOSFET, with trench gate terminal, and to a corresponding manufacturing process.

Description of the Related Art

As it is known, power trench-gate MOSFETs are vertical-conduction devices, in which the gate terminal is buried in a trench made in a surface portion of a body of semiconductor material, typically silicon, at a first surface thereof so as to obtain a vertical conductive channel for transfer of the electrical charges from a first conduction terminal, located at the first surface, towards a second conduction terminal, located at an opposite surface of the same body of semiconductor material.

Figure 1:
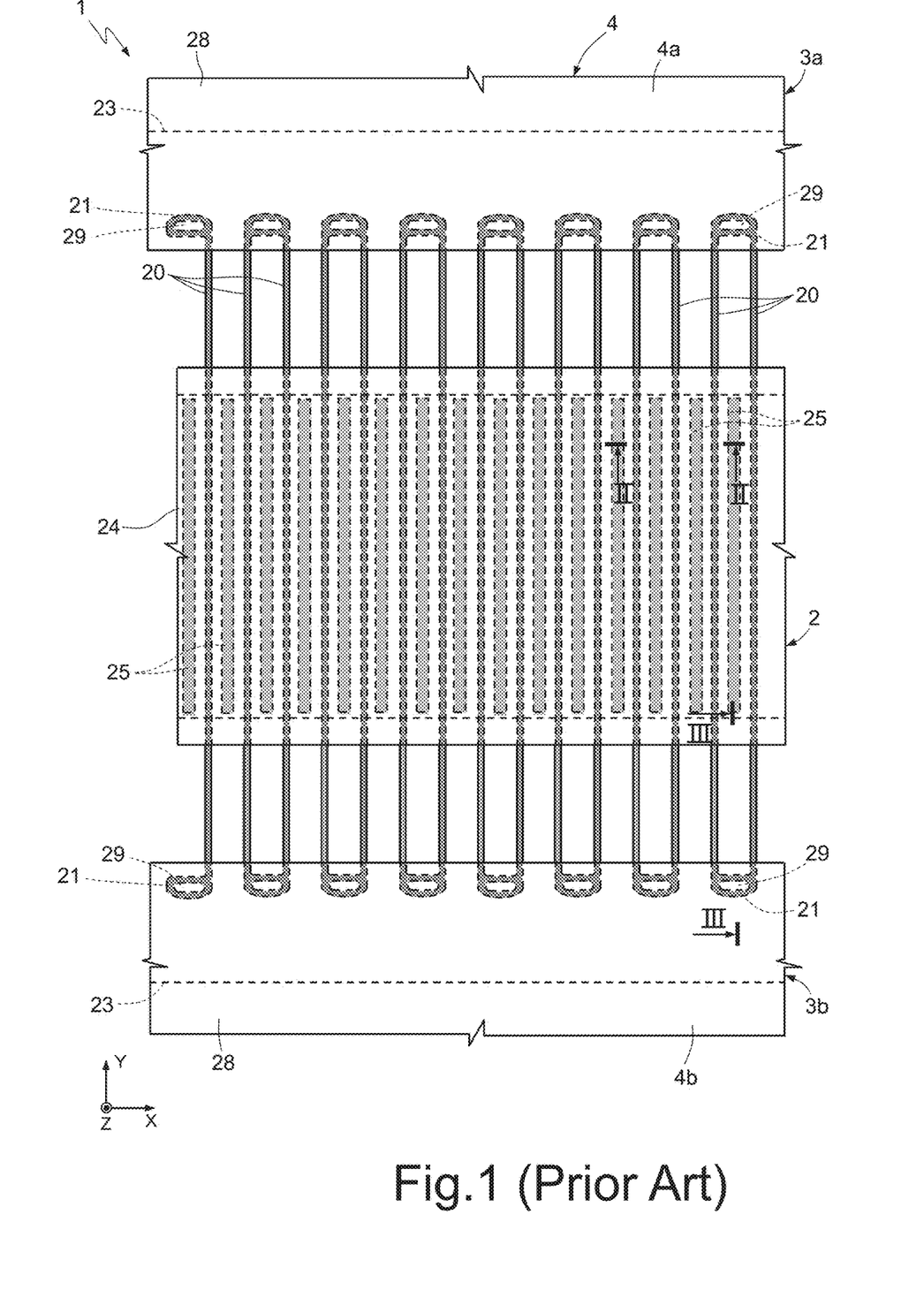
FIG. 1 is a top plan view of a trench-gate power MOSFET of a known type.

FIG. 1 is a top plan view of a trench-gate power MOSFET 1 of a known type. In particular, the MOSFET 1 is shown in a horizontal plane xy of a Cartesian reference system xyz (it should be noted that in FIG. 1 only the elements relevant for an understanding of the present solution are illustrated).

The MOSFET 1 comprises: an active area (also known as "channel area" or "channel region") 2, in which a plurality of elementary cells or units of the transistor are provided and in which, during operation, the conduction channel is defined; and a first peripheral area 3a and a second peripheral area 3b, arranged at a certain distance from, and on opposite sides of, the active area 2 (in the example, along the axis y of the horizontal plane xy), in which a first portion 4a and a second portion 4b of a gate metallization 4 are provided (in a way not illustrated herein, the first and second portions 4a, 4b of the gate metallization 4 are electrically connected together and biased at a same electrical potential).

Figure 2:
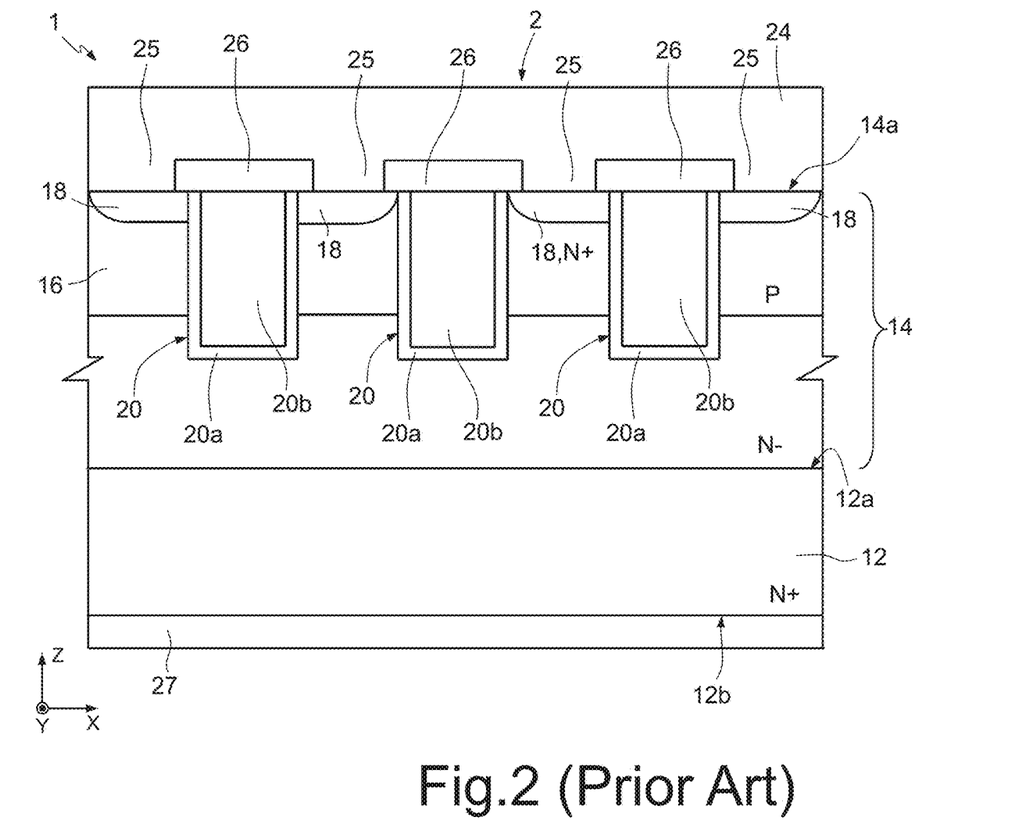
FIG. 2 is a cross-sectional view, taken along the line II-II of FIG. 1, of the power MOSFET of a known type.

With reference also to FIG. 2, which is a cross-sectional view taken along the line II-II of FIG. 1, the MOSFET 1 comprises a substrate 12, made of doped semiconductor material, for example silicon with a N type doping. The substrate 12 has a first surface 12a and a second surface 12b, opposite to one another along a vertical axis z of the aforesaid Cartesian reference system xyz.

A structural layer 14, of doped semiconductor material, for example silicon with a N type doping, is arranged on the first surface 12a of the substrate 12. The structural layer 14 is, for example, epitaxially grown on the substrate 12 and is delimited at the top by a top surface 14a.

The structural layer 14 houses, at the active area 2, a body region 16, in the example having a P type doping, extending in depth in the structural layer 14 starting from the top surface 14a.

Source regions 18, in the example having a N type doping, are arranged inside the body region 16, giving out onto the top surface 14a of the structural layer 14.

The MOSFET 1 further comprises trench gate regions 20 formed in respective trenches, which extend in the structural layer 14 from the top surface 14a towards the substrate 12. Each trench, which houses a respective gate region 20, has a depth greater than the thickness of the body region 16 and less than the thickness of the structural layer 14.

Each gate region 20 comprises an insulating outer portion 20a (made, for example, of silicon oxide, $SiO_2$) and a conductive inner portion 20b (made, for example, of polysilicon), which are arranged so that the conductive portion 20b is insulated from the structural layer 4 by the insulating portion 20a.

In particular, each gate region 20 extends in length (main extension) in the respective trench (in the example, in a direction parallel to the y axis), passing through the whole active area 2, until it reaches the peripheral areas 3a, 3b. Basically, the MOSFET 1 has a plurality of so-called gate stripes or fingers, parallel to one another.

Figure 3:
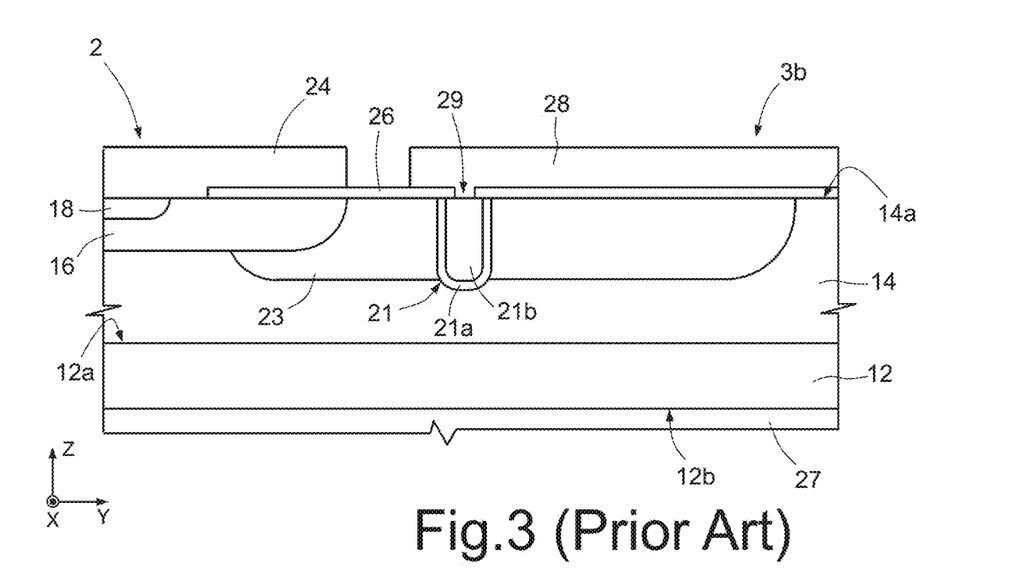
FIG. 3 is a cross-sectional view, taken along the line of FIG. 1, of the power MOSFET of a known type.

As illustrated also in FIG. 3, which is a cross-sectional view taken along the line of FIG. 1, adjacent pairs of gate regions 20 are physically and electrically connected together by connection regions 21, each coupled to opposite ends, with respect to the y axis, of the gate regions 20, in positions corresponding to the peripheral areas 3a, 3b. These connection regions 21 extend, in the example parallel to the x axis, in respective trenches formed in the structural layer 14 in a seamless way with respect to the trenches of the gate regions 20 and comprise, in a way altogether similar to the same gate regions 20, respective insulating outer portions 21a (made, for example, of silicon oxide, $SiO_2$) and conductive inner portions 21b (made, for example, of polysilicon).

FIG. 3 also shows an edge-termination ring 23, formed, in a known way (here not described in detail), in the surface portion of the structural layer 14 in the peripheral areas 3a, 3b.

It should moreover be noted that the gate regions 20 arranged externally with respect to the active area 2 may be provided with connection regions 21 of their own, coinciding with their own respective ends (in other words, they are not coupled to an adjacent gate region 20, which in this case is not present).

The MOSFET 1 further comprises, at the sole active area 2, a source metallization 24, constituted by a conductive layer, for example made of metal, which extends above the top surface 14a of the structural layer 14, in direct contact with the source regions 18, to enable biasing thereof during operation (hence constituting a source-contact terminal, i.e., a first current-conduction terminal, of the MOSFET 1). The source metallization 24 has a planar extension substantially corresponding to the extension of the active area 2 in the horizontal plane xy.

The source metallization 24 contacts the source regions 18 by means of a plurality of contact elements 25, which extend in respective contact openings made through an insulating layer 26, which is made, for example, of silicon oxide or borophosilicate glass (BPSG) and coats the top surface 14a of the structural layer 14 (and in particular insulates the source metallization 24 from the conductive portions 20b of the gate regions 20 that give out onto the top surface 14a of the structural layer 14).

The aforesaid contact elements 25 have a longitudinal main extension, in the form of stripes, in the example along the y axis, parallel to the gate regions 20, basically passing through the active area 2 and being interposed between the same gate regions 20.

In the peripheral areas 3a, 3b, the respective gate metallization 4a, 4b of the MOSFET 1 is constituted by a respective conductive layer 28, for example a metal layer, which extends above the top surface 14a of the structural layer 14, in direct contact with the connection regions 21, in particular with the corresponding conductive portions 21b, to enable biasing of the gate regions 20 (hence constituting the gate contact terminal of the MOSFET 1, electrically insulated from the source-contact terminal).

In particular, the gate metallization 28 contacts the connection regions 21 by means of respective contact elements 29, which extend in respective contact openings made through the insulating layer 26.

Moreover, as shown in the aforesaid FIG. 2, a further conductive layer 27 extends on the second surface 12b of the substrate 12, in direct electrical contact with the substrate 12, forming a drain contact terminal of the MOSFET 1 (i.e., a second current-conduction terminal of the MOSFET 1).

BRIEF SUMMARY

The present Applicant has realized that the aforesaid MOSFET 1 is not optimized as regards electrical performances, in particular the resistance of the gate terminal (constituted by the parallel of all resistances defined by the aforesaid gate stripes or fingers), which may be high, at least for given applications, and moreover the reliability and robustness.

An aim of the present disclosure is to provide a solution that will enable the drawbacks of the known solutions to be overcome.

According to the present disclosure, a trench-gate field effect transistor and a corresponding manufacturing process are hence provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be described in detail, one aspect of the present solution envisages providing a field effect transistor, in particular a MOSFET 30, having a different layout in the horizontal plane xy of the trench gate regions, in particular having a first plurality of gate stripes (made in respective trenches), which extend in a first direction of the horizontal plane xy (for example, along the y axis), and moreover a second plurality of gate stripes (made in respective trenches), which extend in a second direction of the same horizontal plane xy (in the example, along the x axis), intersecting the gate stripes of the first plurality in the active (or channel) area, to jointly define a grid, or lattice, in the same active area.

Figure 4:
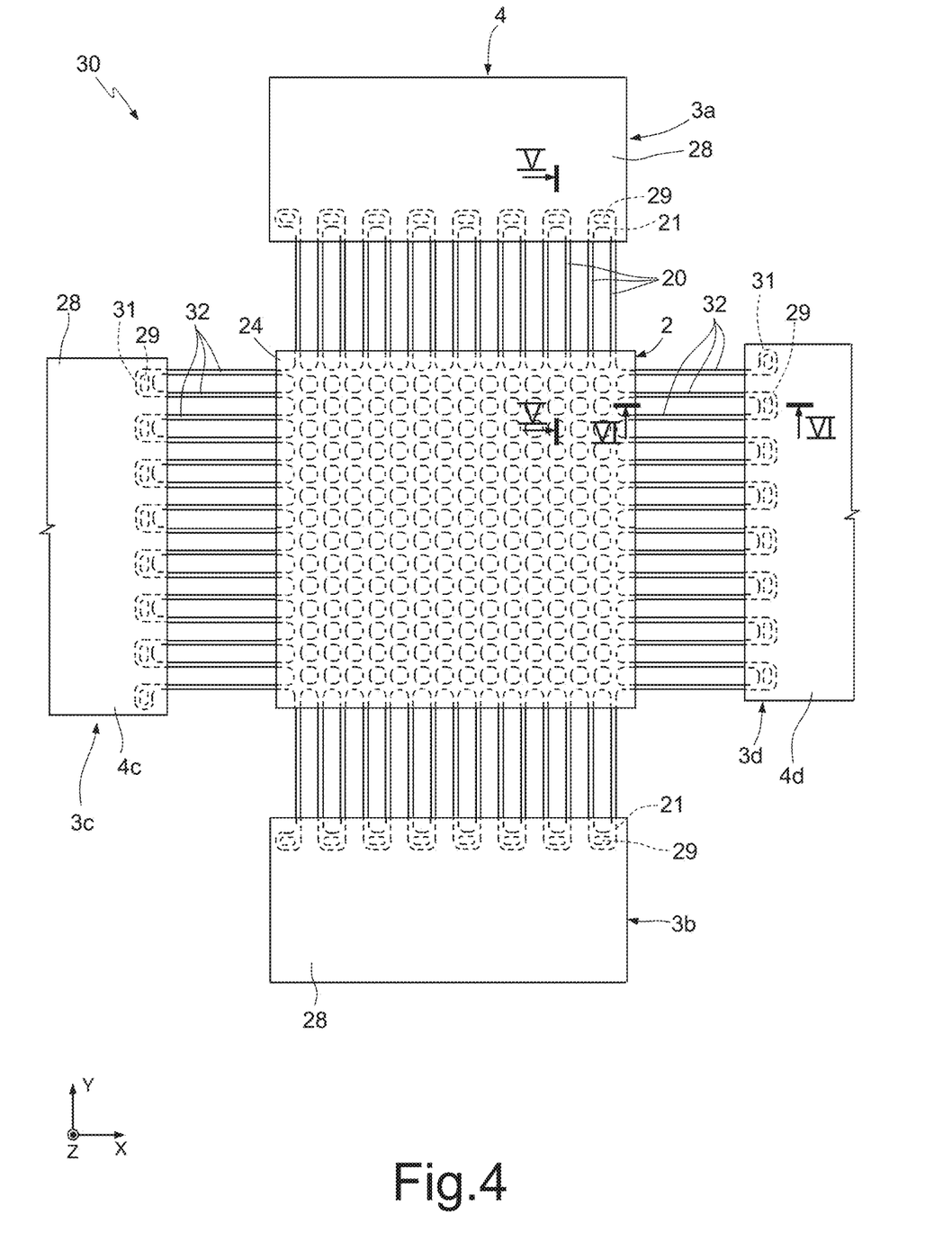
FIG. 4 is a top plan view of a trench-gate power MOSFET, according to an embodiment of the present solution.

With initial reference to FIG. 4, the MOSFET 30 in this case comprises: first gate regions, designated once again by 20 (in analogy with what has been described with reference to FIG. 1), formed in respective trenches, which extend in length, in the form of stripes, in a direction parallel to the y axis, passing through the whole active area 2, until they reach the peripheral areas 3a, 3b; and moreover second gate regions, designated by 32, formed in respective trenches which extend in length, in the form of stripes, in a direction parallel to the x axis, passing through the whole active area 2, until they reach further peripheral areas 3c, 3d, which are arranged at a certain distance from, and on opposite sides of, the active area 2 along the same x axis.

The first and second gate regions 20, 32 are uniformly distributed, with a constant pitch along the x and y axes and moreover have substantially the same length and width dimensions in the horizontal plane xy.

Figure 5:
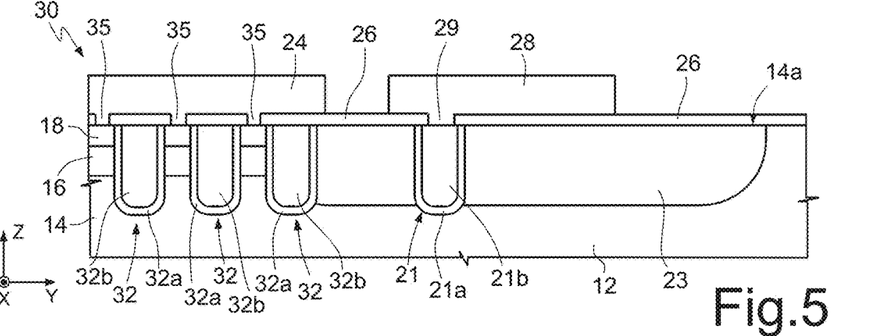
FIG. 5 is a cross-sectional view taken along the line V-V of the MOSFET of FIG. 4.

With reference also to FIG. 5, similarly to the first gate regions 20, also the second gate regions 32 extend in the structural layer 14 (it should be noted that elements similar to others described previously are here and in what follows designated by the same reference numbers) from the top surface 14a towards the substrate 12. Moreover, each second gate region 32 comprises a respective insulating outer portion 32a (made, for example, of silicon oxide, $SiO_2$) and a conductive inner portion 32b (made, for example, of polysilicon), which are mutually arranged so that the conductive portion 32b is insulated from the structural layer 14 by the insulating portion 32a.

The MOSFET 30 thus comprises in this case third and fourth portions 4c, 4d of the gate metallization 4.

Figure 6:
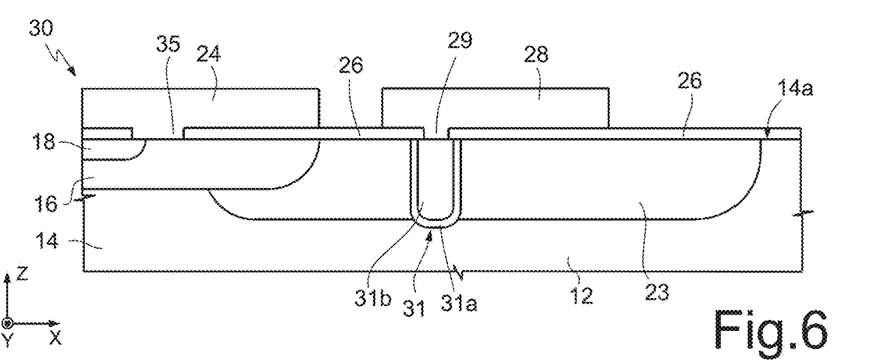
FIG. 6 is a cross-sectional view taken along the line VI-VI of the MOSFET of FIG. 4.

In addition, and also with reference to FIG. 6, similarly to what has been discussed previously, adjacent pairs of the second gate regions 32 are physically and electrically connected together by further connection regions 31, each coupled to opposite ends with respect to the axis x of the second gate regions 32, in a position corresponding to the peripheral areas 3c, 3d.

These connection regions 31 extend, in the example parallel to the axis y, in respective trenches formed, seamlessly with respect to the trenches of the second gate regions 32, in the structural layer 14 and comprise, in a way altogether similar to the second gate regions 32, respective insulating outer portions 31a (made, for example, of silicon oxide, $SiO_2$) and conductive inner portions 31b (made, for example, of polysilicon).

In a way not illustrated herein, the first, second, third, and fourth portions 4a-4d of the gate metallization 4 are electrically connected together and biased at a same electrical potential.

It should moreover be noted that also the second gate regions 32 arranged externally with respect to the active area 2 may possibly be provided with connection regions 31 of their own that coincide with their own respective ends (i.e., they are not coupled to an adjacent second gate region 32, which in this case is not present).

Figure 7:
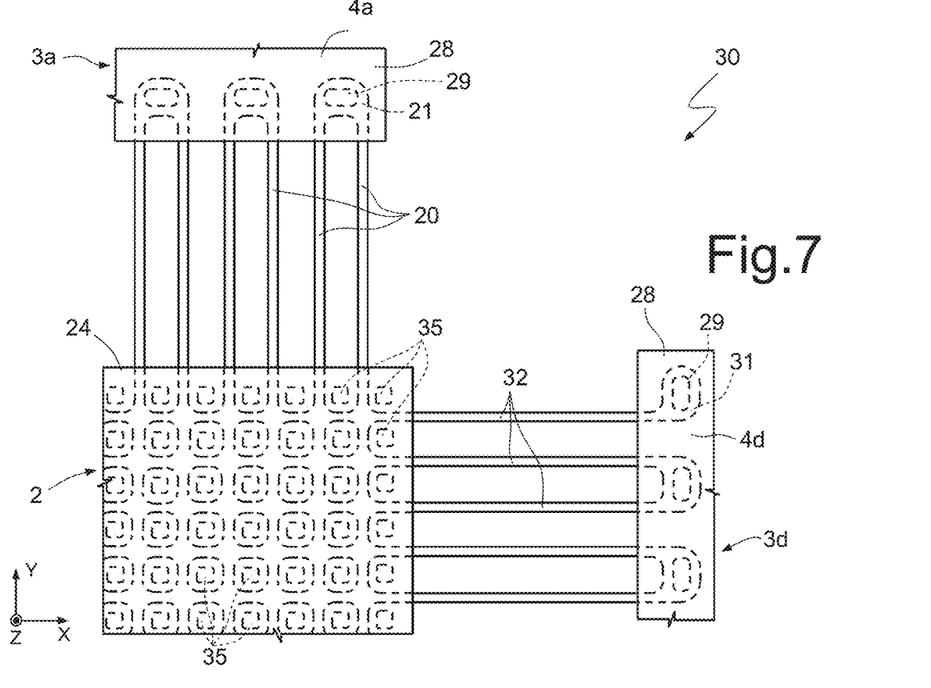
FIG. 7 shows at an enlarged scale a portion in the active area of the MOSFET of FIG. 4.

As highlighted in greater detail in the enlargement of FIG. 7, the contact elements, here designated by 35, which enable the source metallization 24 (which is once again constituted by a metal layer with planar extension substantially corresponding to the extension of the active area 2) to contact the source regions 18, have in this case a shape that is as a whole polygonal, for example square (as in the example illustrated) or rectangular, and extend at the meshes of the grid or lattice formed jointly by the gate stripes crossing one another in the active area 2.

In particular, the contact elements 35 extend above the regions of the structural layer 14 comprised between, and defined by crossing of, a pair of first gate regions 20 adjacent to one another and a pair of second gate regions 32 adjacent to one another.

Consequently, in this embodiment, the contact elements 35 are evenly distributed in the active area 2, with a uniform pitch along the x and y axes.

Figure 8:
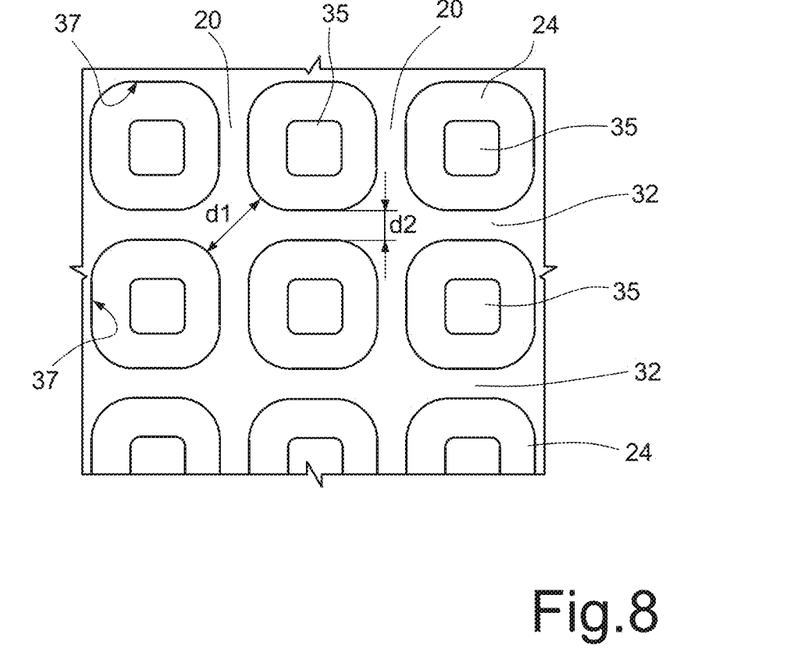
FIG. 8 is a further enlargement of a part of the portion of FIG. 7.

As shown once again FIG. 7, and moreover in the further enlargement of FIG. 8, according to an aspect of the present solution, the gate stripes of the first and second pluralities (likewise, the first gate regions 20 and second gate regions 32) crossing in the active area 2 do not form sharp 90° angles; rather, the area of crossing between the first and second gate regions 20, 32 has rounded corners.

Figure 9:
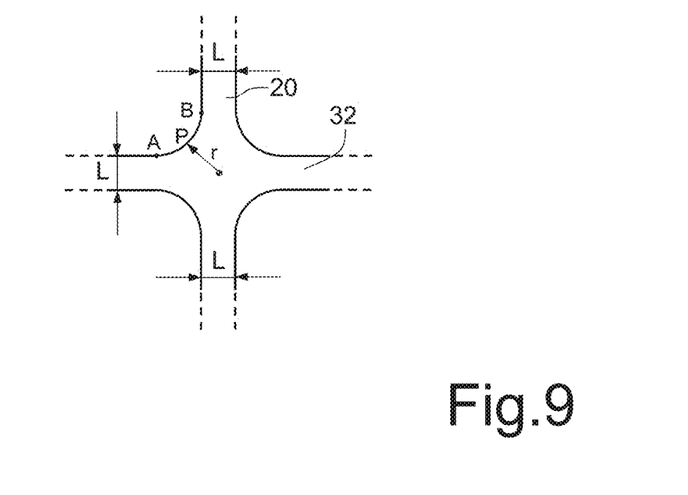
FIG. 9 is a schematic illustration of the area of crossing of orthogonal gate stripes in the MOSFET of FIG. 4.

In particular, the first and second stripes join with a non-zero curvature radius, having a value that is approximately half the width of the first and second stripes (considered outside the area of crossing); for example, the value of the curvature radius r may vary by approximately 10-15% with respect to the aforesaid half-width of the stripes. In greater detail, in FIG. 9 the width of the first and second stripes is designated by L and the curvature radius by r. This curvature radius r is calculated in a point P of the curve that joins a first stripe and a second stripe at the corresponding area of crossing-over, the point P being substantially equidistant from the ends A, B of the joining curve (i.e., the points of contact of the joining curve with the external perimeter of the first and second stripes).

In other words, the first and second stripes are shaped so that the meshes of the lattice resulting from their crossing-over in the active area 2 are not square or rectangular, but have a roughly elliptical shape. In the aforesaid FIG. 8, these meshes are designated by 37.

The above layout characteristics advantageously enable a reduction of the mechanical stresses, in particular in the conductive portions 20b, 32b of polysilicon, of the first and second trenches 20, 32, as a result of the aforesaid crossing-over.

With reference once again to FIG. 8, it may be noted that the maximum width (in the horizontal plane xy) of the gate trenches in the area of crossing between the first and second gate regions 20, 32, designated by d1, is greater than the maximum width of the same gate trenches outside the area of crossing-over, which is designated by d2 (this value moreover corresponding to the aforesaid width L).

It should be noted, in this regard, that the depth reached in the structural layer 14 by a trench, which is dug by means of an anisotropic etch, increases as the width of the trench itself increases.

The present Applicant has, however, noted, by means of experimental tests and simulations, that the differences in depth that occur on account of the different trench width are minimal and such as not to entail a lack of homogeneity in the electrical behavior.

Figure 10:
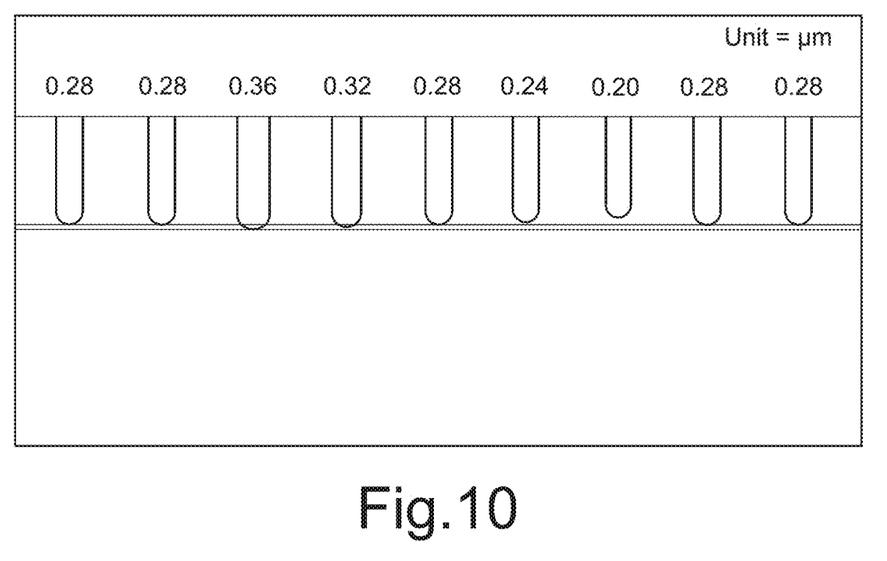
FIG. 10 is a cross-sectional view of a test semiconductor material body, in which trenches with variable widths are formed.

In this regard, FIG. 10 shows the result of an experimental test, which shows that the depths of trenches (dug with a same anisotropic etch by means of a same masking), having widths that differ from one another (in the example, from a minimum value of 0.20 µm to a maximum value of 0.36 µm), have reduced variations, with a maximum value comprised between +/−5% with respect to the mean depth value.

The advantages of the present solution emerge clearly from the foregoing description.

In any case, it is underlined that the solution described allows achieving a considerable reduction in the gate resistance of the MOSFET 30, thanks to the increase in the number of gate contacts and in the number of gate resistances connected in parallel.

A considerable reduction in the on-state resistance (Rd-son) of the MOSFET 30 is obtained, thanks to the increase in the perimeter of the conduction channel. In this regard, the present Applicant has noted an increase by approximately 2.5 times of the contribution of the channel perimeter as compared to a known solution (for example, with the layout described with reference to FIG. 1), considering the same value of the surface of the active area 2. For example, considering an active area 2 with a surface of 378 $\mu m^2$, the channel perimeter is 608 µm for the solution according to the prior art (FIG. 1) and 1543 µm for the present solution (FIG. 4).

The increase in the number of gate contacts moreover enables an increase in fault tolerance, reliability, and robustness of the MOSFET 30 as compared to traditional solutions.

In this regard, it is highlighted that defects in the formation of the contact openings through the insulating layer 26 in which the contact elements 29 (gate contacts) are provided, and/or electrical stresses that impair the same contact elements 29, may cause an absence of biasing of the respective gate regions 20, 32, which may thus be floating, with consequent problems in the various operating phases of the MOSFET 30 and the introduction of parasitic capacitive effects that may interfere with proper operation of the same MOSFET 30.

Moreover, as on the other hand has been highlighted previously, the layout of the gate stripes in the active area 2 advantageously enables reduction of the mechanical stresses that may be generated as a result of the crossing-over between the gate stripes.

The characteristics highlighted make particularly advisable use of the MOSFET 30 in electronic systems in which stringent constraints are present in regard to electrical performances and moreover a high reliability and robustness to faults is required.

Figure 11:
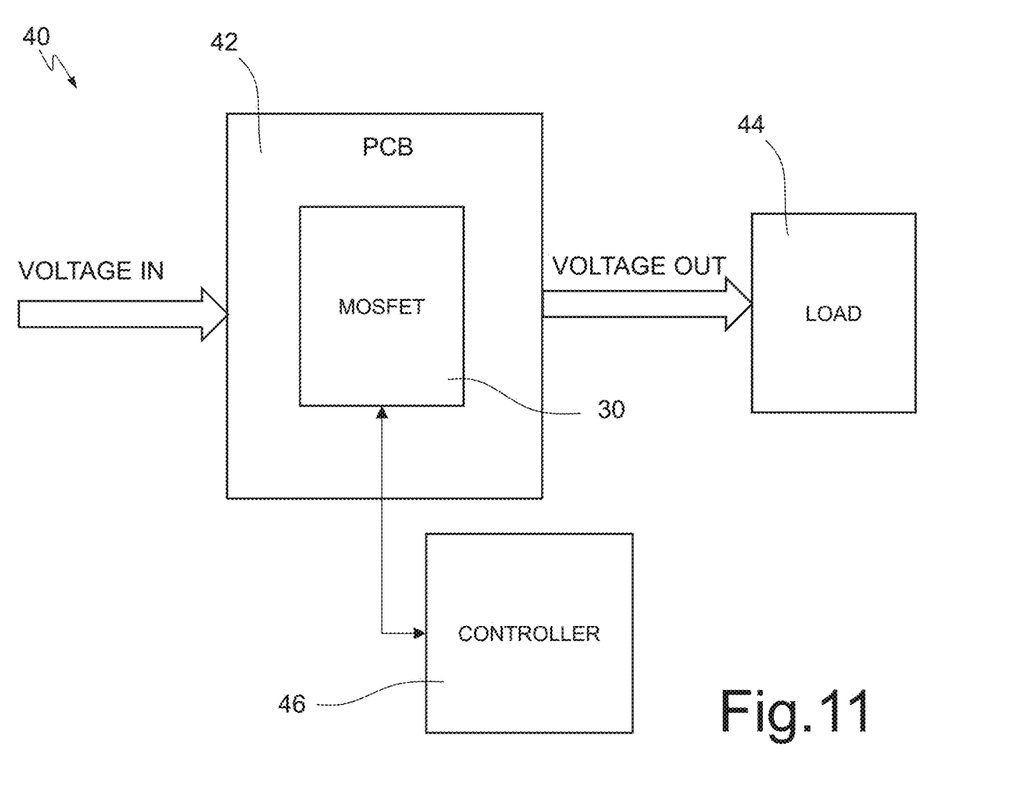
FIG. 11 shows an electronic system including the MOSFET of FIG. 4.

For example, FIG. 11 shows a block diagram of an electronic system 40 using the MOSFET 30 (or a plurality of MOSFETs 30).

The MOSFET 30 is integrated in a board 42, for example a PCB (printed-circuit board), which is configured to receive, during operation, from a power-supply system (here not illustrated), an input voltage (IN) that biases the MOSFET 30, and to supply an output voltage (OUT) to a load 44. Moreover, the MOSFET 30 is connected to a controller 46, which, during operation, verifies and monitors the operating conditions of the electronic system 40.

In a possible application, the MOSFET 30 operates as an electronic fuse; namely, it acts as a protection element for the board 42 and the power-supply system in the event of current overloads and/or shorted loads; in other words, if the MOSFET 30 detects a momentary current peak downstream of the electronic system 40 as a result, for example, of a short circuit, the same MOSFET 30 acts as current generator and limits the value of current, thus protecting the electronic system 40.

The MOSFET 30, in addition to minimizing the peak current, enables a continuous monitoring of the electronic system 40, communicating the presence of possible operating failures to the controller 46.

Finally, it is clear that modifications and variations may be made to what has been described and illustrated, without thereby departing from the scope of the present disclosure.

In particular, it is again underlined that the solution described can find advantageous application in all field effect-transistor structures, having a trench gate terminal.

Moreover, it is evident that modifications may be made to what has been described previously, for example with reference to the layout of the MOSFET 30 outside the active area 2, for instance as regards the arrangement of the connection regions 21, 31 that physically and electrically connect together the first and second gate regions 20, 32 in the peripheral areas 3a-3d.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A field effect transistor, comprising:
a semiconductor layer with a top surface extending in a horizontal plane, and including an active area;
trench gate regions which extend in depth in said active area of the semiconductor layer in a direction transverse to said top surface, and each include an insulating coating layer and a conductive inner layer; and
source regions adjacent to said trench gate regions and configured to form a conduction channel with vertical extension in the active area, wherein said trench gate regions comprise:
a plurality of first gate regions which extend in length as first stripes through said active area along a first direction of the horizontal plane, and
a plurality of second gate regions which extend in length as second stripes through said active area along a second direction of the horizontal plane, orthogonal to, and crossing, said first gate regions in said active area;
wherein the semiconductor layer includes a first peripheral area and a second peripheral area, arranged at a certain distance from, and on opposite sides of, the active area in said first direction, and a third peripheral area and a fourth peripheral area, arranged at a certain distance from, and on opposite sides of, the active area in said second direction;
wherein said first gate regions extend until they reach said first and second peripheral areas, and said second gate regions extend until they reach said third and fourth peripheral areas; the transistor further comprising:
a gate metallization that includes first, second, third, and fourth portions arranged on said top surface of said semiconductor layer;
first contact elements that provide electrical contact between the first portion of the gate metallization and said first gate regions in said first peripheral area;
second contact elements that provide electrical contact between the second portion of the gate metallization and said first gate regions in said second peripheral area;
third contact elements that provide electrical contact between the third portion of the gate metallization and said second gate regions in said third peripheral area; and
fourth contact elements that provide electrical contact between the fourth portion of the gate metallization and said second gate regions in said fourth peripheral area.

2. The field effect transistor according to claim 1, wherein said first gate regions and said second gate regions cross one another in said active area joining with a non-zero curvature radius.

3. The field effect transistor according to claim 2, wherein said first gate regions and said second gate regions have a width in said horizontal plane, and wherein said curvature radius has a value that is approximately half of said width.

4. The field effect transistor according to claim 3, wherein said curvature radius does not depart from half of said width by more than 15%.

5. The field effect transistor according to claim 1, wherein said first gate regions and said second gate regions jointly form in said active area a lattice, having meshes with an elliptical shape in said horizontal plane.

6. The field effect transistor according to claim 5, wherein said lattice has a lattice width in said horizontal plane, in areas of crossing between said first gate regions and said second gate regions, that is greater than a lattice width outside said areas of crossing.

7. The field effect transistor according to claim 1, further comprising:
first connection regions that connect adjacent first gate regions of the plurality of first gate regions to each other at said first peripheral area;
second connection regions that connect the adjacent first gate regions to each other at said second peripheral area;
third connection regions that connect adjacent second gate regions of the plurality of second gate regions to each other at said third peripheral area; and
fourth connection regions that connect the adjacent second gate regions to each other at said fourth peripheral area, wherein said first, second, third, and fourth contact elements respectively contact said first, second, third, and fourth connection regions.

8. The field effect transistor according to claim 1, further comprising:
a source metallization arranged above said top surface of said semiconductor layer and above said active area
contact elements that electrically connect the source metallization to the source regions, wherein said contact elements are arranged in a distributed manner above regions of said active area between, and defined by the crossing of, a respective pair of the first gate regions adjacent to one another and a respective pair of the second gate regions adjacent to one another.

9. The field effect transistor according to claim 8, wherein said first gate regions and second gate regions jointly form in said active area a lattice, and said contact elements are arranged at meshes of said lattice.

10. The field effect transistor according to claim 1, wherein the field transistor is a power MOSFET.

11. An electronic system, comprising:
a field effect transistor that includes:
a semiconductor layer with a top surface extending in a horizontal plane, and including an active area;
trench gate regions which extend in depth in said active are of the semiconductor layer, in a direction transverse to said top surface, and each include an insulating coating layer and a conductive inner layer; and source regions adjacent to said trench gate regions and configured to form a conduction channel with vertical extension in the active area, wherein said trench gate regions comprise:

a plurality of first gate regions which extend in length as first stripes through said active area along a first direction of the horizontal plane, and a plurality of second gate regions which extend in length as second stripes through said active area along a second direction of the horizontal plane, orthogonal to, and crossing, said first gate regions in said active area; and a printed-circuit board configured to receive an input voltage, to bias the field effect transistor, and to supply an output voltage to an electrical load;

wherein the semiconductor layer includes a first peripheral area and a second peripheral area, arranged at a certain distance from, and on opposite sides of, the active area in said first direction, and a third peripheral area and a fourth peripheral area, arranged at a certain distance from, and on opposite sides of, the active area in said second direction;

wherein said first gate regions extend until they reach said first and second peripheral areas, and said second gate regions extend until they reach said third and fourth peripheral areas; the transistor further including:

a gate metallization that includes first, second, third, and fourth portions arranged on said top surface of said semiconductor layer;

first contact elements that provide electrical contact between the first portion of the gate metallization and said first gate regions in said first peripheral area;

second contact elements that provide electrical contact between the second portion of the gate metallization and said first gate regions in said second peripheral area;

third contact elements that provide electrical contact between the third portion of the gate metallization and said second gate regions in said third peripheral area; and fourth contact elements that provide electrical contact between the fourth portion of the gate metallization and said second gate regions in said fourth peripheral area.

12. The electronic system according to claim 11, further comprising:

a controller operatively coupled to the field effect transistor and configured to verify and monitor operating conditions of the electronic system, wherein said field effect transistor is configured to operate as an electronic fuse that protects said electronic system.

13. The electronic system according to claim 11, wherein the field effect transistor further includes:

first connection regions that connect adjacent first gate regions of the plurality of first gate regions to each other at said first peripheral area;

second connection regions that connect the adjacent first gate regions to each other at said second peripheral area;

third connection regions that connect adjacent second gate regions of the plurality of second gate regions to each other at said third peripheral area; and fourth connection regions that connect the adjacent second gate regions to each other at said fourth peripheral area, wherein said first, second, third, and fourth contact elements respectively contact said first, second, third, and fourth connection regions.

14. The electronic system according to claim 11, wherein the field effect transistor further includes:

a source metallization arranged above said top surface of said semiconductor layer and above said active area contact elements that electrically connect the source metallization to the source regions, wherein said contact elements are arranged in a distributed manner above regions of said active area between, and defined by the crossing of, a respective pair of the first gate regions adjacent to one another and a respective pair of the second gate regions adjacent to one another.

15. The electronic system according to claim 14, wherein said first gate regions and second gate regions jointly form in said active area a lattice, and said contact elements are arranged at meshes of said lattice.

* * * * *